United States Patent
Park et al.

(10) Patent No.: US 12,284,854 B2
(45) Date of Patent: Apr. 22, 2025

(54) DISPLAY DEVICE USING SEMICONDUCTOR LIGHT EMITTING DIODE

(71) Applicant: LG ELECTRONICS INC., Seoul (KR)

(72) Inventors: Sangdae Park, Seoul (KR); Sungjin Park, Seoul (KR); Jaegwang Um, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 566 days.

(21) Appl. No.: 17/607,613

(22) PCT Filed: May 7, 2019

(86) PCT No.: PCT/KR2019/005385
§ 371 (c)(1),
(2) Date: Oct. 29, 2021

(87) PCT Pub. No.: WO2020/222343
PCT Pub. Date: Nov. 5, 2020

(65) Prior Publication Data
US 2022/0216382 A1   Jul. 7, 2022

(30) Foreign Application Priority Data
Apr. 30, 2019   (KR) .................. 10-2019-0050963

(51) Int. Cl.
*H10H 20/856* (2025.01)
*H01L 23/00* (2006.01)
(Continued)

(52) U.S. Cl.
CPC ....... *H10H 20/856* (2025.01); *H01L 25/0753* (2013.01); *H01L 24/32* (2013.01);
(Continued)

(58) Field of Classification Search
CPC .......... H01L 33/60; H01L 33/56; H01L 33/62
See application file for complete search history.

(56) References Cited

U.S. PATENT DOCUMENTS 7,683,393 B2 * 3/2010 Nagai .................... H05K 1/183
257/E33.056
8,592,855 B2 * 11/2013 Kim ........................ H01L 27/15
257/E33.059
(Continued)

FOREIGN PATENT DOCUMENTS

EP          2 945 197 A1    11/2015
JP          2004-311467 A    11/2004
(Continued)

*Primary Examiner* — Mark W Tornow
(74) *Attorney, Agent, or Firm* — Birch, Stewart, Kolasch & Birch, LLP

(57) ABSTRACT

Discussed is a display device using a semiconductor light emitting diode disposed on a substrate, a planarization layer stacked on the substrate while defining a hole that is a region in which the semiconductor light emitting diode is disposed, a light-transmitting layer filling the hole, and a reflective layer formed along at least one surface of the substrate and the planarization layer defining an inner surface of the hole, wherein the hole is formed so that a width thereof expands as a distance from the substrate increases.

18 Claims, 21 Drawing Sheets

(51) Int. Cl.
*H01L 25/075* (2006.01)
*H10H 20/01* (2025.01)
*H10H 20/854* (2025.01)
*H10H 20/857* (2025.01)

(52) U.S. Cl.
CPC .............. *H01L 2224/32227* (2013.01); *H10H 20/0363* (2025.01); *H10H 20/854* (2025.01); *H10H 20/857* (2025.01)

(56) References Cited

U.S. PATENT DOCUMENTS

| | | | | |
|---|---|---|---|---|
| 8,735,930 | B2* | 5/2014 | Brunner | H01S 5/0232 |
| | | | | 257/E33.058 |
| 2004/0208210 | A1* | 10/2004 | Inoguchi | H01L 24/97 |
| | | | | 257/E33.072 |
| 2014/0159064 | A1* | 6/2014 | Sakariya | H01L 25/167 |
| | | | | 257/88 |
| 2016/0372528 | A1* | 12/2016 | Kamura | H10K 50/865 |

FOREIGN PATENT DOCUMENTS

| | | | |
|---|---|---|---|
| KR | 10-2007-0089194 | A | 8/2007 |
| KR | 10-2012-0114977 | A | 10/2012 |
| KR | 10-2015-0119149 | A | 10/2015 |
| KR | 10-2018-0050113 | A | 5/2018 |
| KR | 10-2018-0051874 | A | 5/2018 |
| KR | 10-2018-0081378 | A | 7/2018 |
| KR | 10-1877236 | B1 | 7/2018 |

\* cited by examiner 152 156 171 170 140 110 120 160 130

DISPLAY DEVICE USING SEMICONDUCTOR LIGHT EMITTING DIODE

CROSS REFERENCE TO RELATED APPLICATIONS

This application is the National Stage filing under 35 U.S.C. 371 of International Application No. PCT/KR2019/005385, filed on May 7, 2019, which claims the benefit of earlier filing date and right of priority to Korean Application No. 10-2019-0050963, filed on Apr. 30, 2019, the contents of all these applications are hereby incorporated by reference herein in their entirety.

TECHNICAL FIELD

The present disclosure relates to a display device, and more particularly, to a display device using a semiconductor light emitting diode having a size of several μm to several tens of μm.

BACKGROUND ART

Recently, in the field of display technology, display devices with excellent characteristics, such as thin film display devices and flexible display devices, are under development. On the other hand, representative currently commercialized major displays are liquid crystal display (LCD) and active matrix organic light emitting diode (AMOLED). However, the LCD has disadvantages in terms of slow response time and difficult implementation of flexibility, and the AMOLED has weaknesses in terms of short lifespan and production yield.

On the other hand, light emitting diodes (LEDs) are semiconductor light emitting diodes widely known to convert electric current into light. Starting with the commercialization of red LEDs using a GaAsP compound semiconductor in 1962, the LEDs have been used as a light source for display images of electronic devices, including information and communication devices, along with GaP:N-based green LEDs. If the semiconductor light emitting diodes are used to implement display devices, a method for solving the above-described problem may be proposed.

In this regard, recently, research and development has been conducted into display devices using micro-LEDs. Since such display devices have high image quality and high reliability, such display devices attract attention as a next-generation display.

However, a conventional display device using a micro-LED has a structure in which the micro-LED emitting light is surrounded by a transparent layer, and light loss occurs in the rear and side surfaces of a panel, which deteriorates image quality of the display device.

DISCLOSURE OF INVENTION

Technical Problem

Embodiments of the present disclosure provide a display device using a semiconductor light emitting diode having a structure capable of efficiently collecting light emitted from the semiconductor light emitting diode to a front surface of a panel.

Technical Solution

A display device according to an embodiment of the present disclosure includes a substrate, a semiconductor light emitting diode disposed on the substrate, a planarization layer stacked on the substrate while defining a hole that is a region in which the semiconductor light emitting diode is disposed, a light-transmitting layer filling the hole, and a reflective layer formed along at least one surface of the substrate and the planarization layer defining an inner surface of the hole, wherein the hole may be formed so that a width thereof expands as a distance from the substrate increases.

In the present embodiment, a cross-sectional shape of the hole cut in a plane perpendicular to the substrate may have a bilaterally symmetrical structure.

In the present embodiment, the hole may include a plurality of regions partitioned based on an arbitrary height, wherein thicknesses of the respective regions in a height direction may be equal to each other, or a thickness of at least one of the plurality of regions in the height direction may be different from a thickness of another region in the height direction.

In the present embodiment, the planarization layer may be inclined in a direction to expand the width of the hole as the distance from the substrate increases.

In the present embodiment, the hole may include a plurality of regions partitioned based on an arbitrary height, wherein slopes of the planarization layer included in the respective regions with respect to the substrate or an imaginary plane parallel to the substrate may be equal to each other, or a slope of the planarization layer included in at least one of the plurality of regions with respect to the substrate or the imaginary plane parallel to the substrate may be different from a slope of the planarization layer included in another region.

In the present embodiment, the planarization layer may include a plurality of layers stacked in a height direction of the hole, and at least adjacent layers may be made of different materials.

In the present embodiment, the reflective layer may be formed so that a portion formed along one surface of the substrate among the inner surfaces of the hole is thicker than a portion formed along one surface of the planarization layer.

In the present embodiment, the reflective layer may further include a first portion extending along at least a portion of an interface between the substrate and the planarization layer.

In the present embodiment, the reflective layer may further include a second portion extending to cover at least a portion of an upper surface of the planarization layer.

In the present embodiment, the reflective layer may include a metal thin film layer having a single-layered or multi-layered structure, wherein the metal thin film layer may be made of one of titanium (Ti), aluminum (Al), silver (Ag), chromium (Cr), molybdenum (Mo), and platinum (Pt), or any combination thereof, and may be formed to a thickness of at least 30 nm or more.

In the present embodiment, the reflective layer may further include a protective layer made of $SiO_2$ or $SiN_x$ on the metal thin film layer.

In the present embodiment, the hole may have a circular horizontal cross-section.

In the present embodiment, the display device may further include a black matrix (BM) on an upper surface of the planarization layer.

Advantageous Effects

A display device using a semiconductor light emitting diode according to an embodiment of the present disclosure has an effect of efficiently collecting light emitted from the semiconductor light emitting diode to a front surface of a panel due to the shape and structural characteristics of a hole in which the semiconductor light emitting diode is disposed.

Specifically, a reflective layer formed along the inner surface of the hole can reflect light leaking through the side or rear surface of the semiconductor light emitting diode toward the front surface of the panel, and the structure of the hole in which the width increases as a distance from a substrate increases and the vertical cross-section is symmetrical has an effect of improving the light collection efficiency.

In addition, the present disclosure has an effect of maximizing the light collection efficiency by applying the structure of the hole changed according to the shape, thickness, structure, and the like of the semiconductor light emitting diode disposed inside the hole.

Furthermore, since a first portion and/or a second portion extending from the reflective layer formed on the inner surface of the hole are included, the present disclosure has an effect of maintaining the light collection efficiency by supplementing the positional precision in a process of assembling the semiconductor light emitting diode.

MODE FOR CARRYING OUT THE INVENTION

Figure 1:
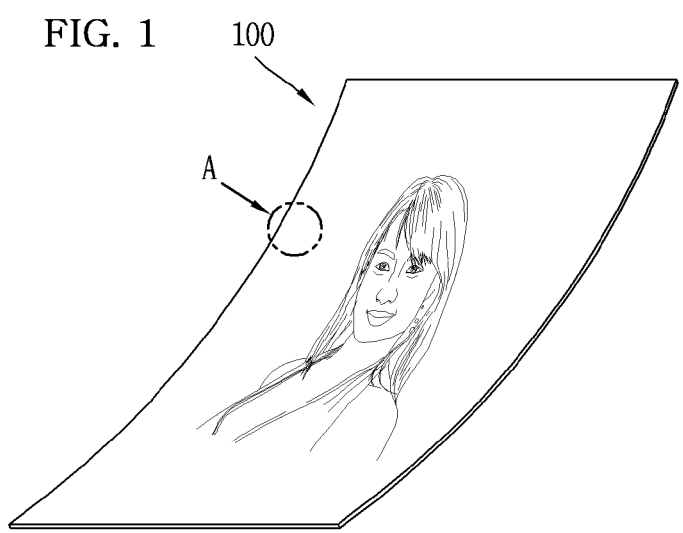
FIG. 1 is a conceptual diagram showing a display device using a semiconductor light emitting diode according to an embodiment of the present disclosure.

Hereinafter, embodiments of the present disclosure are described in detail with reference to accompanying drawings and regardless of the reference symbols, same or similar components are assigned with the same reference numerals and thus overlapping descriptions for those are omitted. The suffixes "module" and "unit" for components used in the description below are assigned or mixed in consideration of easiness in writing the specification and do not have distinctive meanings or roles by themselves. In the following description, detailed descriptions of well-known functions or constructions will be omitted since they would obscure the invention in unnecessary detail. Additionally, the accompanying drawings are used to help easily understanding embodiments disclosed herein but the technical idea of the present disclosure is not limited thereto. In addition, when an element such as a layer, a region, or a substrate is referred to as being "on" another element, it will be understood that the element may be directly on the other element, or intervening elements may be present therebetween.

A display device described in this specification may include a mobile phone, a smart phone, a laptop computer, a digital broadcasting terminal, a personal digital assistant (PDA), a portable multimedia player (PMP), a navigation, a slate PC, a tablet PC, an ultra book, a digital TV, a desktop computer, and the like. However, the configuration according to embodiments described in this specification can be applied as long as it can include a display even in a new product form to be developed later.

FIG. 1 is a conceptual diagram showing a display device using a semiconductor light emitting diode according to an embodiment of the present disclosure.

As shown, information processed by a controller of a display device 100 may be displayed on a flexible display. The flexible display includes a display that is flexible, bendable, twistable, foldable, and rollable by external force. For example, the flexible display may be a display manufactured on a thin and flexible substrate that is flexible, bendable, foldable, or rollable like paper, while maintaining display characteristics of an existing flat panel display.

In a state in which the flexible display is not bent (for example, a state having an infinite radius of curvature, hereinafter referred to as a 'first state'), the display area of the flexible display is a flat surface. In a state in which the flexible device is bent by external force in the first state (for example, a state having a finite radius of curvature, hereinafter referred to as a 'second state'), the display area of the flexible display may be a curved surface. As shown, information displayed in the second state may be visual information output on the curved surface. Such visual information is implemented by independently controlling light emission of sub-pixels arranged in a matrix form. The sub-pixel refers to a minimum unit for implementing one color.

The sub-pixel of the flexible display may be implemented by a semiconductor light emitting diode. In the present disclosure, a light emitting diode (LED) is exemplified as a type of semiconductor light emitting diode that converts electric current into light. The LED is formed in a small size, so that the LED can serve as a sub-pixel even in the second state.

Hereinafter, the flexible display implemented using the LED will be described in more detail with reference to the accompanying drawings.

Figure 2:
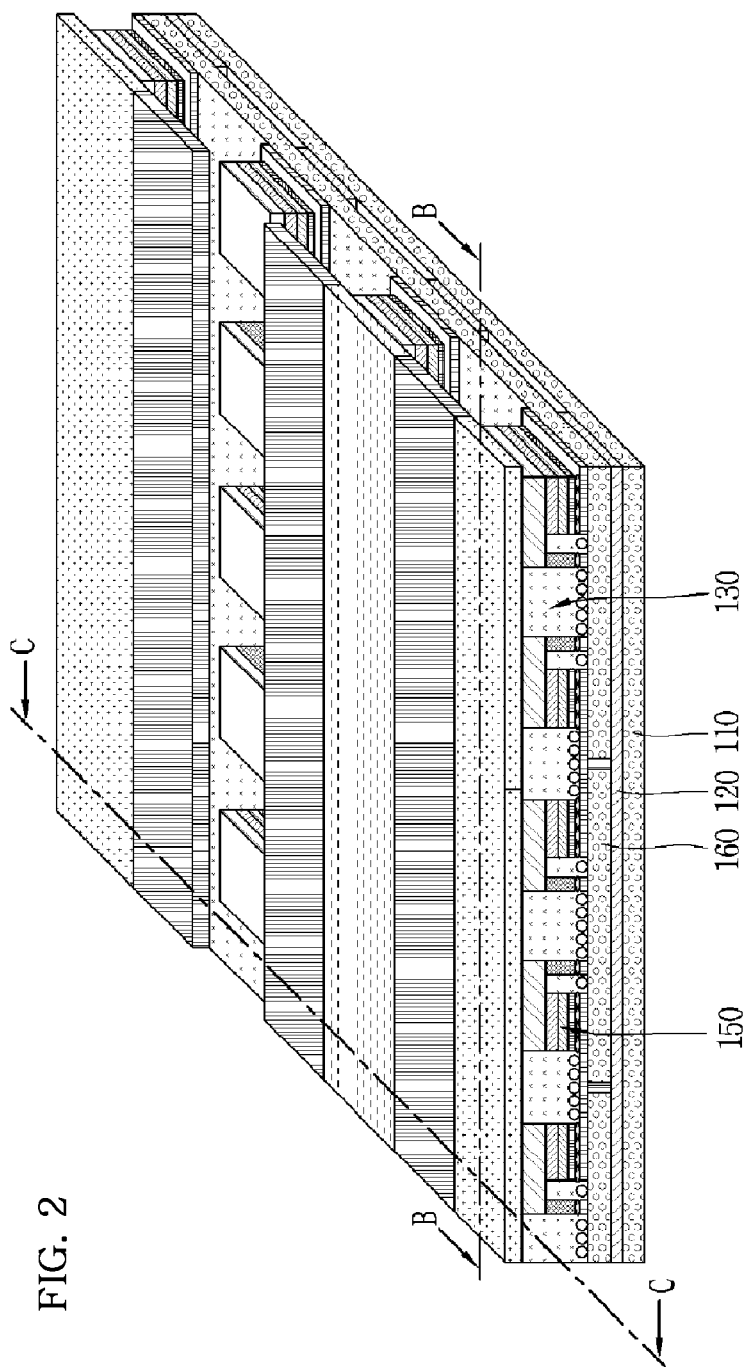
FIG. 2 is a partial enlarged view of portion A of FIG. 1, and FIGS. 3a and 3b are cross-sectional views taken along lines B-B and C-C of FIG. 2, respectively.
Figure 3A:
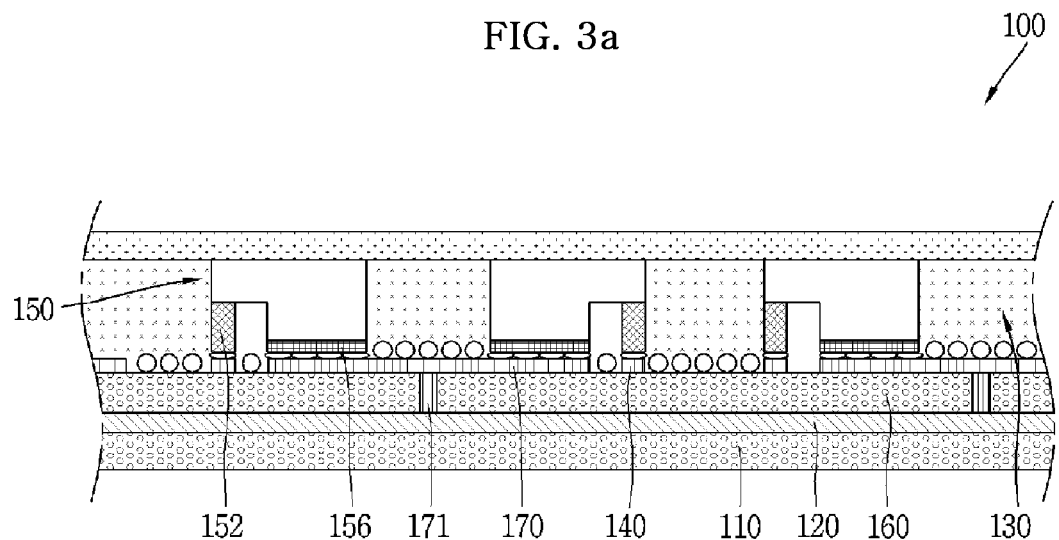
Figure 3B:
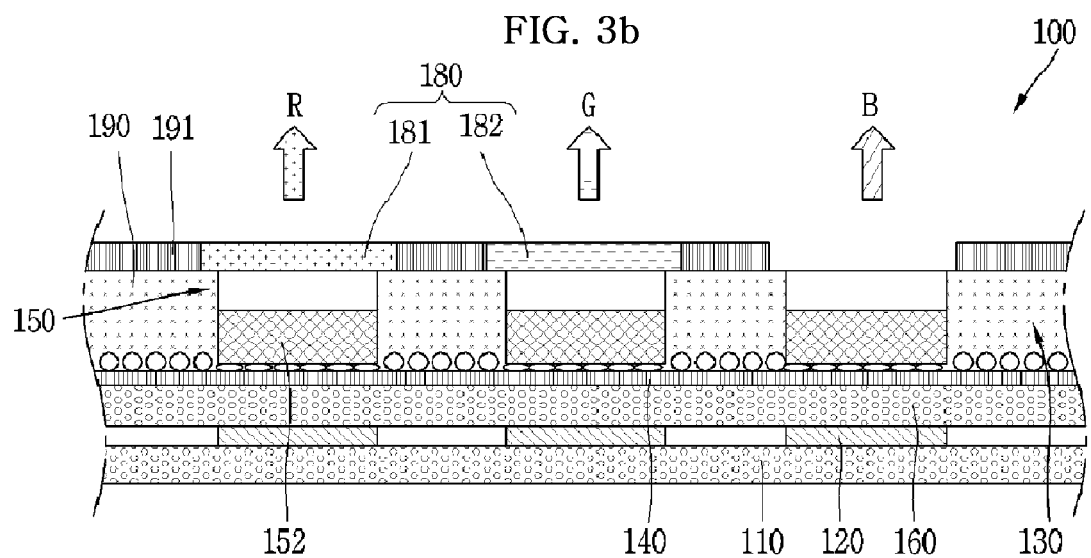
Figure 4:
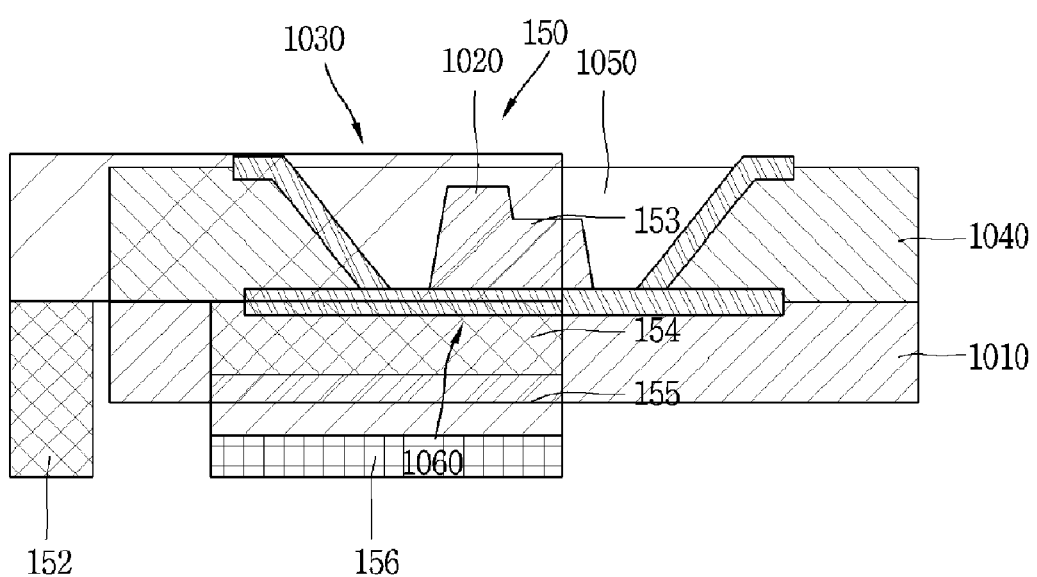
FIG. 4 is a conceptual diagram showing a flip-chip type semiconductor light emitting diode of FIG. 3.

FIG. 2 is a partial enlarged view of portion A of FIG. 1, FIGS. 3a and 3b are cross-sectional views taken along lines B-B and C-C of FIG. 2, respectively, FIG. 4 is a conceptual diagram showing a flip-chip type semiconductor light emitting diode of FIG. 3, and FIGS. 5a to 5c are conceptual diagrams showing various forms of implementing color in relation to the flip-chip type semiconductor light emitting diode.

FIGS. 2, 3a, and 3b show a display device 100 using a passive matrix (PM) type semiconductor light emitting diode as the display device 100 using the semiconductor light emitting diode. However, the following example is also applicable to an active matrix (AM) type semiconductor light emitting diode.

The display device 100 includes a substrate 110, a first electrode 120, a conductive adhesive layer 130, a second electrode 140, and a plurality of semiconductor light emitting diodes 150.

The substrate 110 may be a flexible substrate. The substrate 110 may include glass or polyimide (PI) in order to implement flexible performance. In addition, an insulating and flexible material such as polyethylene naphthalate (PEN), polyethylene terephthalate (PET), and the like may be used as the component of the substrate 110. In addition, the substrate 110 may be any transparent material or any opaque material.

The substrate 110 may be a wiring substrate on which the first electrode 120 is disposed, and the first electrode 120 may be located on the substrate 110.

As shown, an insulating layer 160 may be stacked on the substrate 110 on which the first electrode 120 is located, and an auxiliary electrode 170 may be disposed on the insulating layer 160. In this case, a state in which the insulating layer 160 is stacked on the substrate 110 may be a single wiring substrate. More specifically, the insulating layer 160 includes an insulating and flexible material such as PI, PEN, PET, or the like, and may be integrally formed with the substrate 110 to form a single wiring substrate.

The auxiliary electrode 170 is an electrode electrically connecting the first electrode 120 to the semiconductor light emitting diode 150, and is disposed on the insulating layer 160 and disposed corresponding to the position of the first electrode 120. For example, the auxiliary electrode 170 may have a dot shape and may be electrically connected to the first electrode 120 via an electrode hole 171 penetrating the insulating layer 160. The electrode hole 171 may be formed by filling a hole with a conductive material.

According to the accompanying drawings, the conductive adhesive layer 130 is formed on one surface of the insulating layer 160, but the present disclosure is not necessarily limited thereto. For example, a layer performing a specific function may be formed between the insulating layer 160 and the conductive adhesive layer 130, and a structure in which the conductive adhesive layer 130 is disposed on the substrate without the insulating layer 160 is also possible. In a structure in which the conductive adhesive layer 130 is disposed on the substrate, the conductive adhesive layer 130 may serve as an insulating layer.

The conductive adhesive layer 130 may be a layer having adhesiveness and conductivity, to this end, the conductive adhesive layer 130 may be formed by mixing a material having conductivity with a material having adhesiveness. In addition, the conductive adhesive layer 130 has ductility, thereby enabling a flexible function in the display device.

For example, the conductive adhesive layer 130 may be an anisotropy conductive film (ACF), an anisotropy conductive paste, a solution containing conductive particles, or the like. The conductive adhesive layer 130 allows electrical interconnection in the z-direction passing through the thickness, but may be configured as an electrically insulating layer in the horizontal x-y direction. Therefore, the conductive adhesive layer 130 may be referred to as a z-axis conductive layer (however, hereinafter referred to as a 'conductive adhesive layer').

The anisotropy conductive film is a film in which an anisotropic conductive medium is mixed with an insulating base member, when heat and pressure are applied, the anisotropy conductive film has conductivity only in a specific portion due to the anisotropic conductive medium. In this specification, it is described that heat and pressure are applied to the anisotropy conductive film, but other methods (for example, a method of applying only one of heat and pressure or a UV curing method) may be used in order for the anisotropy conductive film to have partial conductivity.

In addition, the anisotropic conductive medium may be conductive balls or conductive particles. As shown, the anisotropy conductive film is a film in which conductive balls are mixed with an insulating base member, when heat and pressure are applied, the anisotropy conductive film has conductivity only in a specific portion due to the conductive balls. The anisotropy conductive film may be in a state containing particles in which a core of a conductive material is coated with an insulating film made of a polymer material, in this case, the insulating film of the particles contained in a portion to which heat and pressure is applied is destroyed and the anisotropy conductive film has conductivity due to the core. At this time, the shape of the core may be deformed to form layers in contact with each other in the thickness direction of the film. More specifically, heat and pressure are applied to the entire anisotropy conductive film, and electrical connection in the z-axis direction may be partially formed due to a height difference of a counterpart adhered by the anisotropy conductive film.

As another example, the anisotropy conductive film may be in a state in which an insulating core contains a plurality of particles coated with a conductive material. In this case, the conductive material in the portion to which heat and pressure is applied is deformed (stuck) to have conductivity in the thickness direction of the film. As another example, the conductive material may penetrate the insulating base member in the z-axis direction to have conductivity in the thickness direction of the film, in this case, the conductive material may have a pointed end.

As shown, the anisotropy conductive film may be a fixed array anisotropy conductive film (ACF) in which conductive balls are inserted into one surface of an insulating base member. The insulating base member is made of a material having adhesiveness, and the conductive balls are intensively disposed on the bottom portion of the insulating base member, therefore, when heat and pressure are applied from the base member, the base member is deformed together with the conductive ball to have conductivity in the vertical direction.

However, the present disclosure is not necessarily limited thereto, and the anisotropy conductive film may have a form in which conductive balls are randomly mixed in an insulating base member, and may be a double-ACF in which a plurality of layers are provided and conductive balls are disposed on one layer.

The anisotropic conductive paste is a combination of a paste and conductive balls, and may be a paste in which conductive balls are mixed with an insulating and adhesive base material. In addition, the solution containing conductive particles may be a solution containing conductive particles or nanoparticles.

Referring to the accompanying drawings, the second electrode 140 is spaced apart from the auxiliary electrode 170 and is positioned on the insulating layer 160. That is, the conductive adhesive layer 130 is disposed on the insulating layer 160 in which the auxiliary electrode 170 and the second electrode 140 are located.

After the conductive adhesive layer 130 is formed in a state in which the auxiliary electrode 170 and the second electrode 140 are located on the insulating layer 160, if heat and pressure are applied to connect the semiconductor light emitting diode 150 in a flip-chip form, the semiconductor light emitting diode 150 is electrically connected to the first electrode 120 and the second electrode 140.

The semiconductor light emitting diode 150 may be a flip-chip type light emitting diode as shown in FIG. 4.

For example, the semiconductor light emitting diode 150 includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 spaced apart from the p-type electrode 156 in the horizontal direction on the n-type semiconductor layer 153. In this case, the p-type electrode 156 may be electrically connected to the auxiliary electrode 170 by the conductive adhesive layer 130, and the n-type electrode 152 may be electrically connected to the second electrode 140.

Referring to FIGS. 2, 3a, and 3b, the auxiliary electrode 170 is elongated in one direction so that one auxiliary electrode 170 may be electrically connected to the plurality of semiconductor light emitting diodes 150. For example, the p-type electrodes 156 of the semiconductor light emitting diodes 150 on the left and right sides of the auxiliary electrode 170 may be electrically connected to one auxiliary electrode.

Specifically, the semiconductor light emitting diode 150 is press-fitted into the conductive adhesive layer 130 by heat and pressure. Therefore, only a portion between the auxiliary electrode 170 and the p-type electrode 156 of the semiconductor light emitting diode 150 and a portion between the second electrode 140 and the n-type electrode 152 of the semiconductor light emitting diode 150 have conductivity, and the remaining portions have no conductivity because there is no press-fitting of the semiconductor light emitting diode 150. As such, the conductive adhesive layer 130 may mutually couple and electrically connect the semiconductor light emitting diode 150 to the auxiliary electrode 170 and may mutually couple and electrically connect the semiconductor light emitting diode 150 to the second electrode 140.

In addition, the plurality of semiconductor light emitting diodes 150 constitute a light emitting diode array, and a phosphor layer 180 is formed in the light emitting diode array.

The light emitting diode array may include the plurality of semiconductor light emitting diodes 150 having different luminance values. Each of the semiconductor light emitting diodes 150 constitutes a sub-pixel and is electrically connected to the first electrode 120. For example, the first electrode 120 may be provided in plurality. The semiconductor light emitting diodes 150 may be arranged in a plurality of columns. The semiconductor light emitting diodes 150 in each column may be electrically connected to any one of the plurality of first electrodes 120.

In addition, since the semiconductor light emitting diodes 150 are connected in a flip-chip form, the semiconductor light emitting diodes 150 grown on a transparent dielectric substrate may be used. The semiconductor light emitting diodes 150 may be, for example, nitride semiconductor light emitting diodes. Since the semiconductor light emitting diodes 150 has excellent luminance, individual sub-pixels can be configured even with a small size.

Referring to the drawings, partition walls 190 may be formed between the semiconductor light emitting diodes 150. In this case, the partition walls 190 may serve to separate the individual sub-pixels from each other, and may be integrally formed with the conductive adhesive layer 130. For example, since the semiconductor light emitting diode 150 is inserted into the anisotropy conductive film, the base member of the anisotropy conductive film may form the partition wall 190.

In addition, when the base member of the anisotropy conductive film is black, the partition wall 190 may have reflective properties and increase contrast even without a separate black insulator.

As another example, a separate reflective partition wall may be provided as the partition wall 190. In this case, the partition wall 190 may include a black or white insulator depending on the purpose of the display device. When the partition wall 190 made of a white insulator is used, there may be an effect of increasing reflectivity, and when the partition wall 190 made of a black insulator is used, the partition wall 190 may have reflective properties and increase contrast.

The phosphor layer 180 may be located on the outer surface of the semiconductor light emitting diode 150. For example, when the semiconductor light emitting diode 150 is a blue semiconductor light emitting diode that emits blue (B) light, the phosphor layer 180 may perform a function of converting the blue (B) light into a color of a sub-pixel. The phosphor layer 180 may be a red phosphor 181 or a green phosphor 182 constituting an individual pixel.

That is, the red phosphor 181 capable of converting blue (B) light into red (R) light may be stacked on the blue semiconductor light emitting diode 151 at a position constituting a red sub-pixel, and the green phosphor 182 capable of converting blue (B) light into green (G) light may be stacked on the blue semiconductor light emitting diode 151 at a position constituting a green sub-pixel. In addition, only the blue semiconductor light emitting diode 151 may be used alone at the portion constituting the blue sub-pixel. In this case, red (R), green (G), and blue (B) sub-pixels may constitute one pixel. Specifically, the phosphor 180 of one color may be stacked along each line of the first electrode 120, and thus, one line in the first electrode 120 may be an electrode that controls one color. That is, red (R), green (G), and blue (B) may be sequentially disposed along the second electrode 140, and the sub-pixel may be implemented.

However, the present disclosure is not necessarily limited thereto. Instead of the phosphor 180, the semiconductor light emitting diode 150 and quantum dots (QDs) are combined to form red (R), green (G), and blue (B) sub-pixels.

In addition, a black matrix 191 may be disposed between the phosphor layers 180 in order to improve contrast.

However, the present disclosure is not necessarily limited thereto, and other structures for implementing blue, red, and green colors may be applied.

Figure 5A:
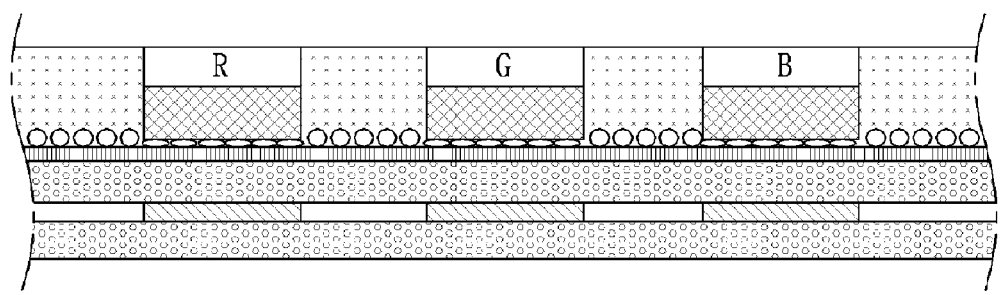
FIGS. 5a to 5c are conceptual diagrams showing various forms of implementing color in relation to the flip-chip type semiconductor light emitting diode.

Referring to FIG. 5a, each of the semiconductor light emitting diodes 150 may be implemented as a high-power light emitting diode that mainly includes gallium nitride (GaN) and includes indium (In) and/or aluminum (Al) added together to emit light of various colors including blue.

In this case, the semiconductor light emitting diode 150 may include red, green, and blue semiconductor light emitting diodes in order to constitute each sub-pixel. For example, red, green, and blue semiconductor light emitting diodes R, G, and B may be alternately disposed, and red, green, and blue sub-pixels may constitute one pixel by the red, green, and blue semiconductor light emitting diodes. In this manner, a full-color display can be implemented.

Figure 5B:
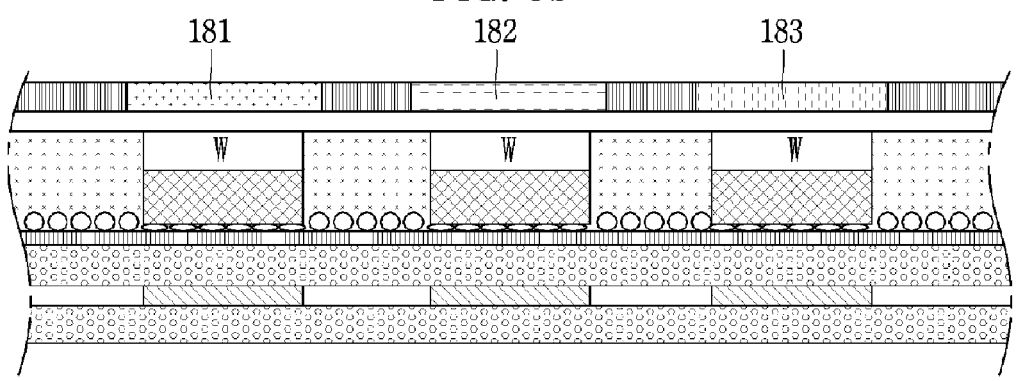

Referring to FIG. 5b, the semiconductor light emitting diode 150 may be a white light emitting diode W in which a yellow phosphor layer is provided for each individual element. In this case, the red phosphor layer 181, the green phosphor layer 182, and the blue phosphor layer 183 may be provided on the white light emitting diode W in order to constitute the sub-pixel. In addition, the sub-pixel may be formed by using a color filter in which red, green, and blue are repeated on the white light emitting diode W.

Figure 5C:
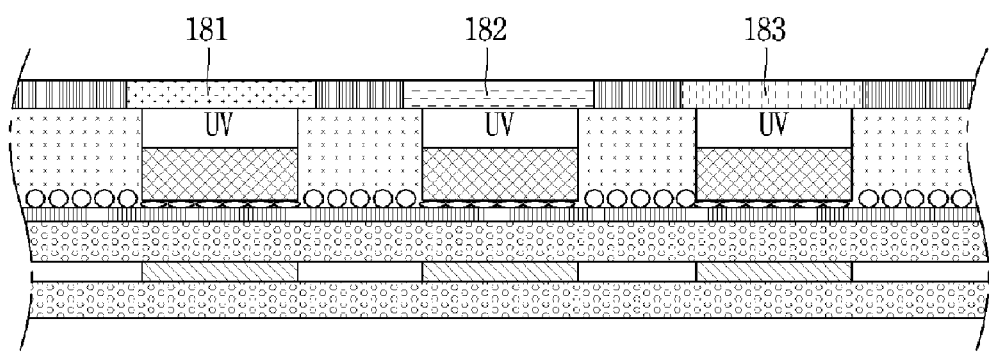

Referring to FIG. 5c, the red phosphor layer 181, the green phosphor layer 182, and the blue phosphor layer 183 may be provided on an ultraviolet light emitting diode UV. As such, the semiconductor light emitting diode 150 can be used in the entire region from the visible ray region to the ultraviolet ray, and can be extended in the form of a semiconductor light emitting diode in which the ultraviolet ray can be used as the excitation source of the upper phosphor.

Referring back to the present example, the semiconductor light emitting diode 150 is located on the conductive adhesive layer 130 to constitute the sub-pixel in the display device. Since the semiconductor light emitting diodes 150 has excellent luminance, individual sub-pixels can be configured even with a small size. The size of the individual semiconductor light emitting diode 150 may be a rectangular or square diode, of which the size of one side is 80 µm or less. In the case of the rectangle diode, the size may be 20×80 µm or less.

In addition, even when the square semiconductor light emitting diode 150, of which the size of one side is 10 µm, is used as the sub-pixel, sufficient brightness to achieve the display device may be realized. Therefore, for example, in a case where a rectangular pixel having a sub-pixel, of which the size of one side is 600 µm and the size of the other side is 300 µm, the distance between the semiconductor light emitting diodes 150 is relatively large enough to implement a flexible display device with HD image quality.

The display device using the semiconductor light emitting diode described above can be manufactured by a new manufacturing method. Hereinafter, the manufacturing method will be described with reference to FIG. 6.

Figure 6:
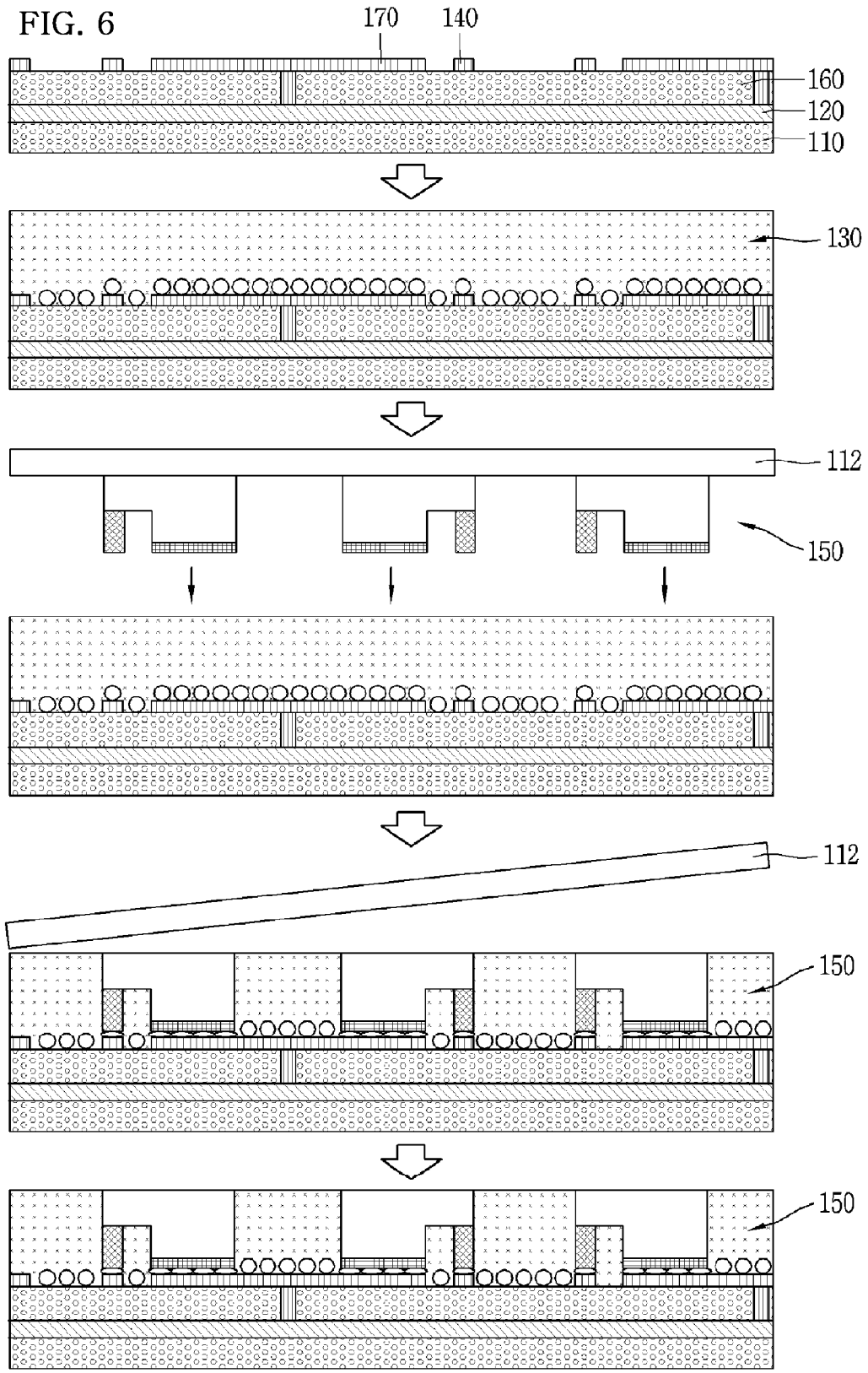
FIG. 6 is a cross-sectional view showing a method of manufacturing a display device using a semiconductor light emitting diode according to the present disclosure.

Referring to FIG. 6, a conductive adhesive layer 130 is formed on an insulating layer 160 on which an auxiliary electrode 170 and a second electrode 140 are located. The insulating layer 160 is stacked on a first substrate 110 to form one substrate (or wiring substrate), and a first electrode 120, an auxiliary electrode 170, and a second electrode 140 are disposed on the wiring substrate. The first electrode 120 and the second electrode 150 may be disposed in a direction perpendicular to each other. In addition, in order to implement a flexible display device, each of the first substrate 110 and the insulating layer 160 may include glass or polyimide (PI).

The conductive adhesive layer 130 may be implemented by an anisotropy conductive film. To this end, the anisotropy conductive film may be applied to the substrate located in the insulating layer 160.

Next, a second substrate 112 on which a plurality of semiconductor light emitting diodes 150 corresponding to the positions of the auxiliary electrodes 170 and the second electrodes 140 and constituting the individual pixels are located is disposed such that the semiconductor light emitting diodes 150 face the auxiliary electrodes 170 and the second electrodes 140.

In this case, the second substrate 112 is a growth substrate for growing the semiconductor light emitting diode 150, and may be a sapphire substrate or a silicon substrate.

The semiconductor light emitting diode 150 can be effectively used in the display device because the semiconductor light emitting diode 150 has a gap and a size that can form the display device when formed in wafer units.

Next, the wiring substrate and the second substrate 112 are thermocompression-bonded to each other. For example, the wiring substrate and the second substrate 112 may be thermocompression-bonded to each other by applying an ACF press head. The wiring substrate and the second substrate 112 are bonded to each other by the thermocompression bonding. Due to the characteristics of the anisotropy conductive film having conductivity by the thermocompression bonding, only a portion between the semiconductor light emitting diode 150 and the auxiliary electrode 170 and the second electrode 140 has conductivity, and the electrodes may be electrically connected to the semiconductor light emitting diode 150. At this time, the semiconductor light emitting diode 150 is inserted into the anisotropy conductive film. Therefore, partition walls may be formed between the semiconductor light emitting diodes 150.

Next, the second substrate 112 is removed. For example, the second substrate 112 may be removed using a laser lift-off (LLO) method or a chemical lift-off (CLO) method.

Finally, the second substrate 112 is removed to expose the semiconductor light emitting diode 150 to the outside. If necessary, a transparent insulating layer (not shown) may be formed by coating the wiring substrate, to which the semiconductor light emitting diode 150 is coupled, with silicon oxide (SiOx) or the like.

In addition, the manufacturing method may further include forming a phosphor layer on one surface of the semiconductor light emitting diode 150. For example, the semiconductor light emitting diode 150 is a blue semiconductor light emitting diode that emits blue (B) light, A red phosphor or a green phosphor for converting the blue (B) light into the color of the sub-pixel may form a layer on one surface of the blue semiconductor light emitting diode.

The manufacturing method or structure of the display device using the semiconductor light emitting diode described above may be modified and implemented in various forms. For example, a vertical semiconductor light emitting diode may be applied as the display device described above. Hereinafter, a vertical structure will be described with reference to FIGS. 5 and 6.

In addition, in the modifications or embodiments described below, the identical or similar reference numerals are assigned to the structures identical to or similar to the previous examples, and the descriptions thereof are replaced with the first description.

Figure 7:
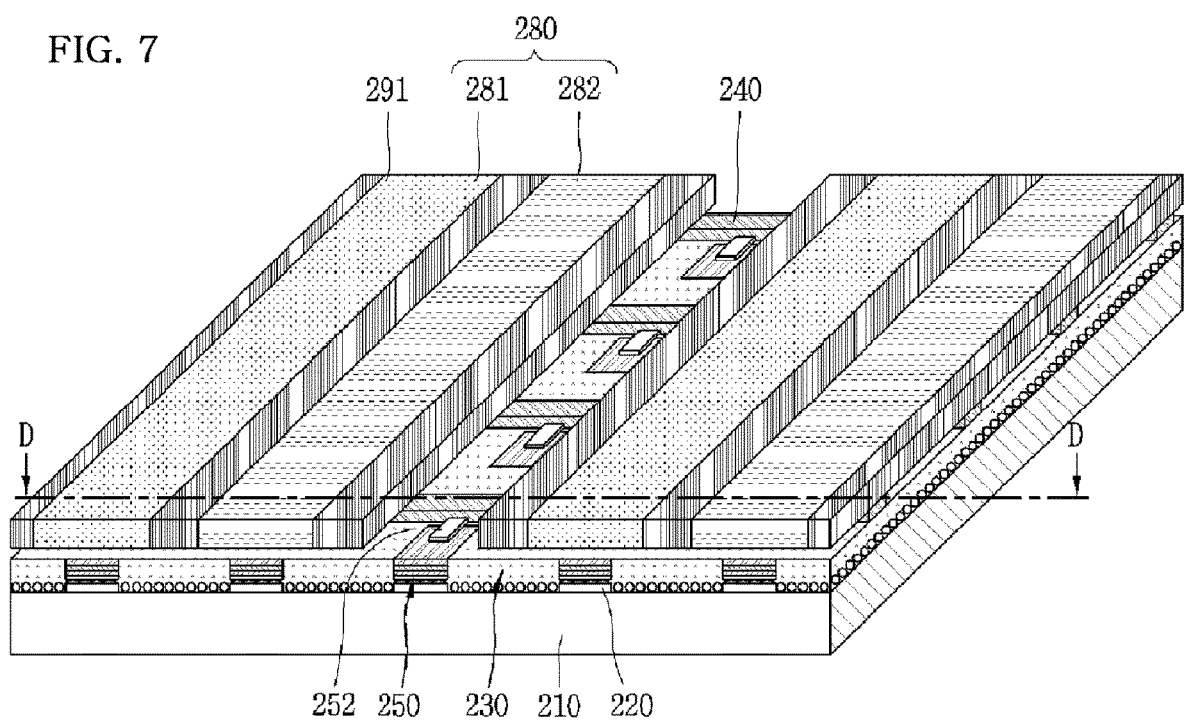
FIG. 7 is a perspective view showing a display device using a semiconductor light emitting diode according to another embodiment of the present disclosure.
Figure 8:
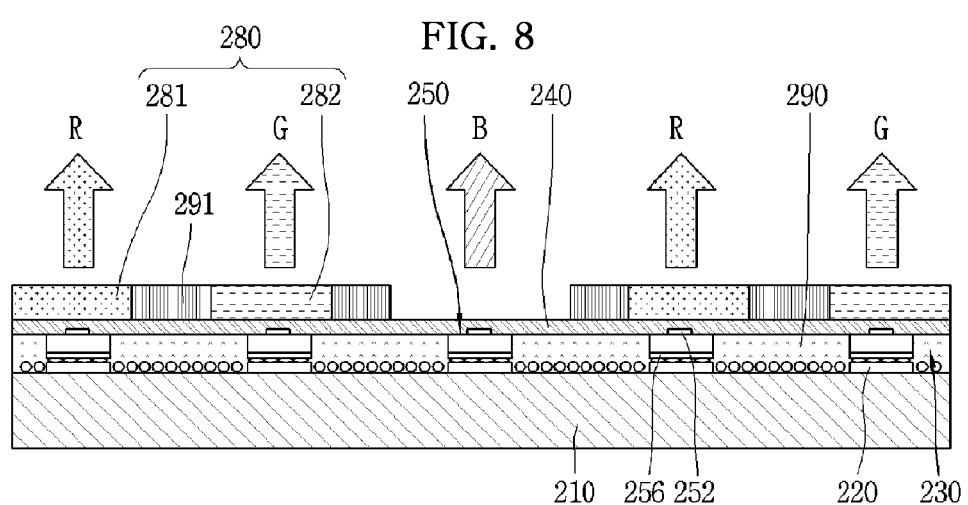
FIG. 8 is a cross-sectional view taken along line D-D of FIG. 7.
Figure 9:
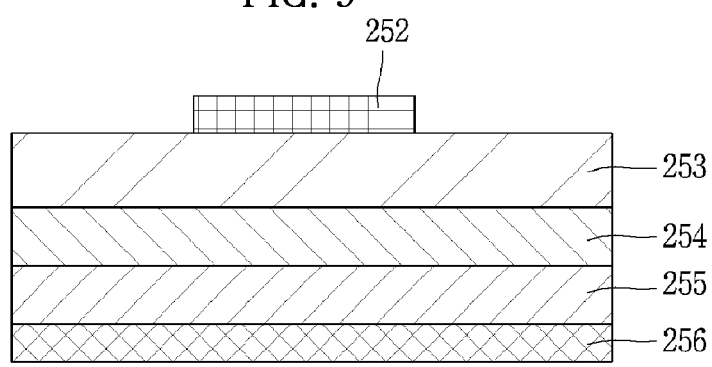
FIG. 9 is a conceptual diagram showing a vertical semiconductor light emitting diode of FIG. 8.

FIG. 7 is a perspective view showing a display device using a semiconductor light emitting diode according to another embodiment of the present disclosure, FIG. 8 is a cross-sectional view taken along line D-D of FIG. 7, and FIG. 9 is a conceptual diagram showing a vertical semiconductor light emitting diode of FIG. 8.

Referring to the drawings, the display device may be a display device using a passive matrix (PM) type vertical semiconductor light emitting diode.

The display device includes a substrate 210, a first electrode 220, a conductive adhesive layer 230, a second electrode 240, and a plurality of semiconductor light emitting diodes 250.

The substrate 210 is a wiring substrate on which the first electrode 220 is disposed, and may include polyimide (PI) in order to implement a flexible display device. In addition, any insulating and flexible materials may be used.

The first electrode 220 is located on the substrate 210 and may be formed as a bar-shaped electrode elongated in one direction. The first electrode 220 may serve as a data electrode.

The conductive adhesive layer 230 is formed on the substrate 210 on which the first electrode 220 is located. Like the display device to which the flip-chip type light emitting diode is applied, the conductive adhesive layer 230 may be an anisotropy conductive film (ACF), an anisotropy conductive paste, a solution containing conductive particles, or the like. However, in the present embodiment as well, a case in which the conductive adhesive layer 230 is implemented by the anisotropy conductive film is exemplified.

When the semiconductor light emitting diode 250 is connected by applying heat and pressure after placing the anisotropy conductive film in a state in which the first electrode 220 is located on the substrate 210, the semiconductor light emitting diode 250 is electrically connected to the first electrode 220. In this case, the semiconductor light emitting diode 250 is preferably disposed on the first electrode 220.

The electrical connection occurs because, as described above, when heat and pressure are applied to the anisotropy conductive film, the anisotropy conductive film has partial conductivity in the thickness direction. Therefore, the anisotropy conductive film is divided into a conductive portion 231 and a non-conductive portion 232 in the thickness direction.

In addition, since the anisotropy conductive film contains an adhesive component, the conductive adhesive layer 230 implements not only electrical connection but also mechanical bonding between the semiconductor light emitting diode 250 and the first electrode 220.

As such, the semiconductor light emitting diode 150 is located on the conductive adhesive layer 130 to constitute the sub-pixel in the display device. Since the semiconductor light emitting diodes 150 has excellent luminance, individual sub-pixels can be configured even with a small size. The size of the individual semiconductor light emitting diode 150 may be a rectangular or square diode, of which the size of one side is 80 μm or less. In the case of the rectangle diode, the size may be 20×80 μm or less.

The semiconductor light emitting diode 250 may have a vertical structure.

A plurality of second electrodes 240 are disposed between the vertical semiconductor light emitting diodes 250 in a direction crossing the length direction of the first electrode 220 and electrically connected to the vertical semiconductor light emitting diodes 250, respectively.

Referring to FIG. 9, the vertical semiconductor light emitting diode includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at a lower portion may be electrically connected to the first electrode 220 by the conductive adhesive layer 230, and the n-type electrode 252 located at an upper portion may be electrically connected to the second electrode 240 to be described later. The vertical semiconductor light emitting diode 250 has a great advantage of reducing the chip size because electrodes can be arranged above and below.

Referring to FIG. 8, a phosphor layer 280 may be formed on one surface of the semiconductor light emitting diode 250. For example, the semiconductor light emitting diode 250 is a blue semiconductor light emitting diode 251 that emits blue (B) light, and a phosphor layer 280 for converting the blue (B) light into a color of a sub-pixel may be included. In this case, the phosphor layer 280 may be a red phosphor 281 or a green phosphor 282 constituting an individual pixel.

That is, the red phosphor 281 capable of converting blue (B) light into red (R) light may be stacked on the blue semiconductor light emitting diode 251 at a position constituting a red sub-pixel, and the green phosphor 282 capable of converting blue (B) light into green (G) light may be stacked on the blue semiconductor light emitting diode 251 at a position constituting a green sub-pixel. In addition, the blue semiconductor light emitting diode 251 may be used alone at the portion constituting the blue sub-pixel. In this case, red (R), green (G), and blue (B) sub-pixels may constitute one pixel.

However, the present disclosure is not necessarily limited thereto, and as described above in the display device to which the flip-chip type light emitting diode is applied, other structures for implementing blue, red, and green colors may be applied.

In the present embodiment, the second electrode 240 is located between the semiconductor light emitting diodes 250 and electrically connected to the semiconductor light emitting diodes 250. For example, the semiconductor light emitting diodes 250 may be arranged in a plurality of columns, and the second electrodes 240 may be located between the columns of the semiconductor light emitting diodes 250.

Since the distance between the semiconductor light emitting diodes 250 constituting the individual pixels is sufficiently large, the second electrodes 240 may be located between the semiconductor light emitting diodes 250.

The second electrode 240 may be formed as a bar-shaped electrode elongated in one direction, and may be disposed in a direction perpendicular to the first electrode 220.

In addition, the second electrode 240 and the semiconductor light emitting diode 250 may be electrically connected to each other by an electrode protruding from the second electrode 240. Specifically, the connection electrode may be the n-type electrode 252 of the semiconductor light emitting diode 250. For example, the n-type electrode 252 is formed as an ohmic electrode for ohmic contact, and the second electrode 240 covers at least a portion of the ohmic electrode by printing or deposition. Therefore, the second electrode 240 and the n-type electrode 252 of the semiconductor light emitting diode 250 may be electrically connected to each other.

As shown, the second electrode 240 may be located on the conductive adhesive layer 230. If necessary, a transparent insulating layer (not shown) including silicon oxide (SiOx) or the like may be formed on the substrate 210 on which the semiconductor light emitting diode 250 is formed. When the second electrode 240 is located after the transparent insulating layer is formed, the second electrode 240 is located on the transparent insulating layer. In addition, the second electrode 240 may be formed spaced apart from the conductive adhesive layer 230 or the transparent insulating layer.

When a transparent electrode such as indium tin oxide (ITO) is used in locating the second electrode 240 on the semiconductor light emitting diode 250, the ITO material has a problem in that it has poor adhesion to the n-type semiconductor layer 253. Therefore, the present disclosure has an advantage of not using a transparent electrode such as ITO by locating the second electrode 240 between the semiconductor light emitting diodes 250. Therefore, the light extraction efficiency can be improved by using a conductive material having good adhesion to the n-type semiconductor layer 253 as a horizontal electrode without being limited by the selection of the transparent material.

Referring to the drawings, partition walls 290 may be located between the semiconductor light emitting diodes 250. The partition walls 290 may be disposed between the vertical semiconductor light emitting diodes 250 in order to isolate the semiconductor light emitting diodes 250 constituting individual pixels. In this case, the partition walls 290 may serve to separate the individual sub-pixels from each other, and may be integrally formed with the conductive adhesive layer 230. For example, since the semiconductor light emitting diode 250 is inserted into the anisotropy conductive film, the base member of the anisotropy conductive film may form the partition wall 290.

In addition, when the base member of the anisotropy conductive film is black, the partition wall 290 may have reflective properties and a contrast ratio may be increased, even without a separate black insulator.

As another example, the partition wall 290 may be separately provided with a reflective partition wall. The partition wall 290 may include a black or white insulator depending on the purpose of the display device.

If the second electrode 240 is directly located on the conductive adhesive layer 230 between the semiconductor light emitting diodes 250, the partition wall 290 may be located between the vertical semiconductor light emitting diode 250 and the second electrode 240. Therefore, individual sub-pixels can be configured with a small size by using the semiconductor light emitting diode 250. Since the distance between the semiconductor light emitting diodes 250 is relatively large, the second electrode 240 can be located between the semiconductor light emitting diodes 250. Therefore, there is an effect that a flexible display device having HD image quality can be implemented.

In addition, a black matrix 291 may be disposed between the phosphors in order to improve contrast.

As described above, the semiconductor light emitting diode 250 is located on the conductive adhesive layer 230 to constitute individual pixels in the display device. Since the semiconductor light emitting diodes 250 has excellent luminance, individual sub-pixels can be configured even with a small size. Therefore, a full-color display in which red (R), green (G), and blue (B) sub-pixels constitute one pixel can be implemented by the semiconductor light emitting diodes 250.

Hereinafter, a display device using a semiconductor light emitting diode (hereinafter, 'display device') having a hole having a structure for efficiently collecting light emitted from the semiconductor light emitting diode to a front surface of a panel will be described in more detail with reference to FIGS. 10 to 14.

Figure 10:
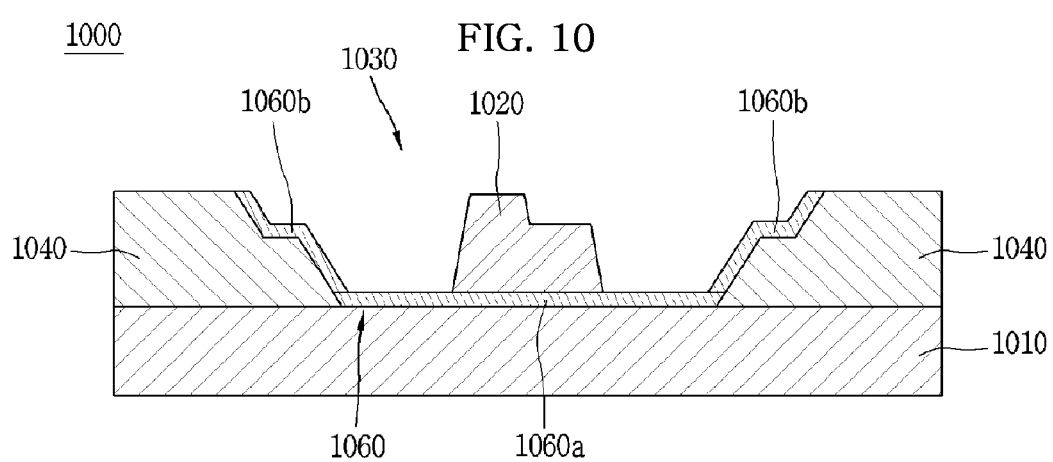
FIG. 10 is a view showing a vertical cross-section of a hole in which the semiconductor light emitting diode is disposed, according to an embodiment of the present disclosure.
Figure 11:
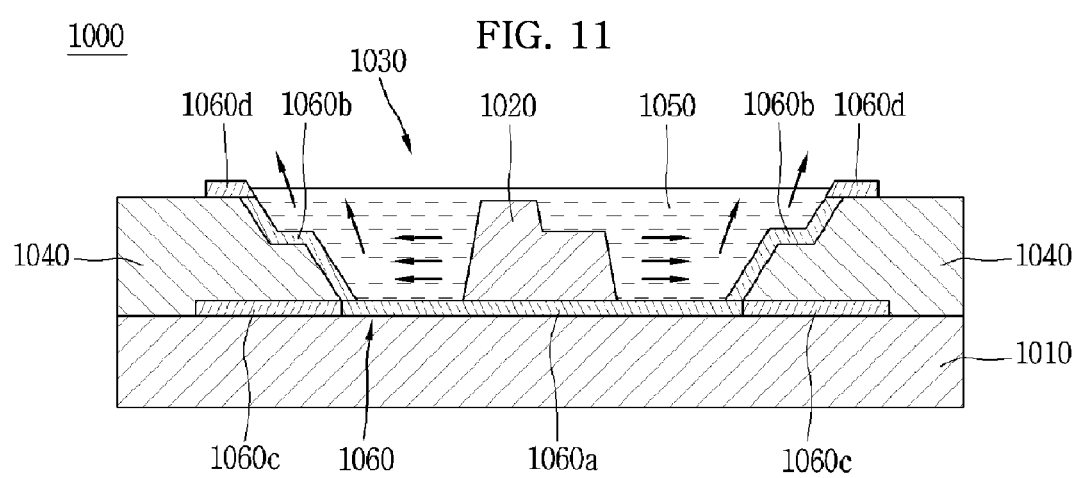
FIG. 11 is a view showing a vertical cross-section of a hole in which the semiconductor light emitting diode is disposed, according to another embodiment of the present disclosure.
Figure 12A:
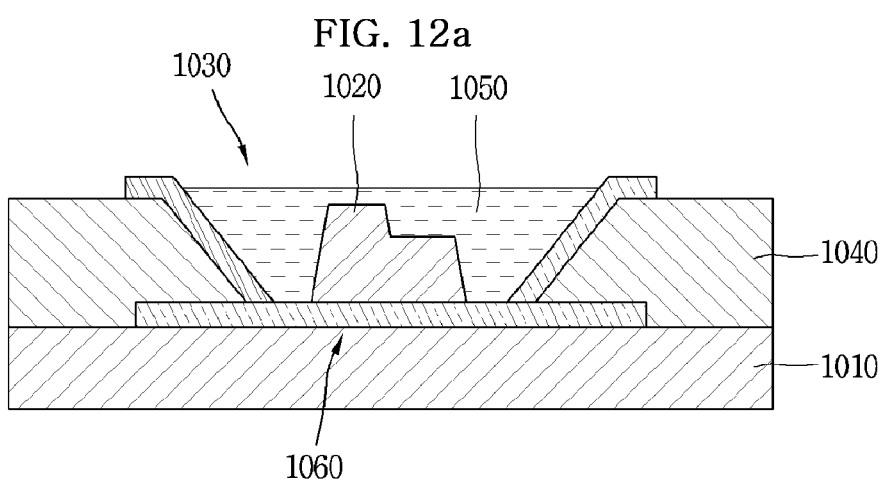
FIGS. 12a to 12e are views showing various embodiments of the hole shown in FIG. 11.
Figure 12B:
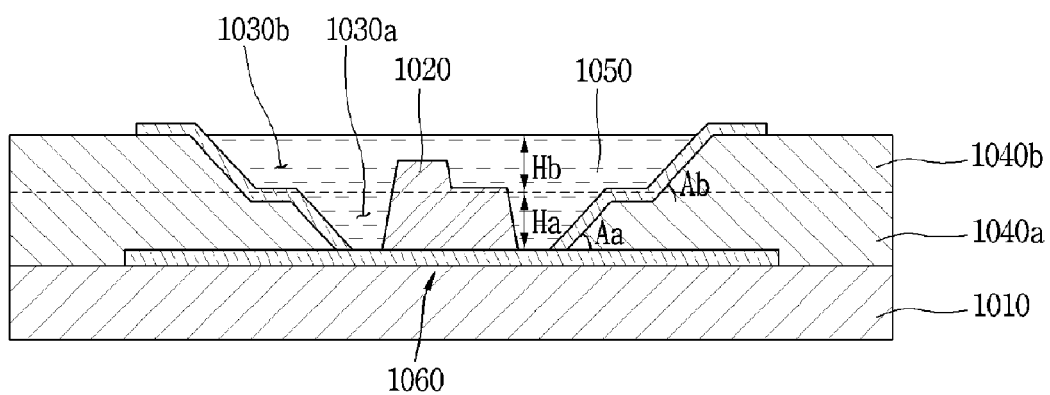
Figure 12C:
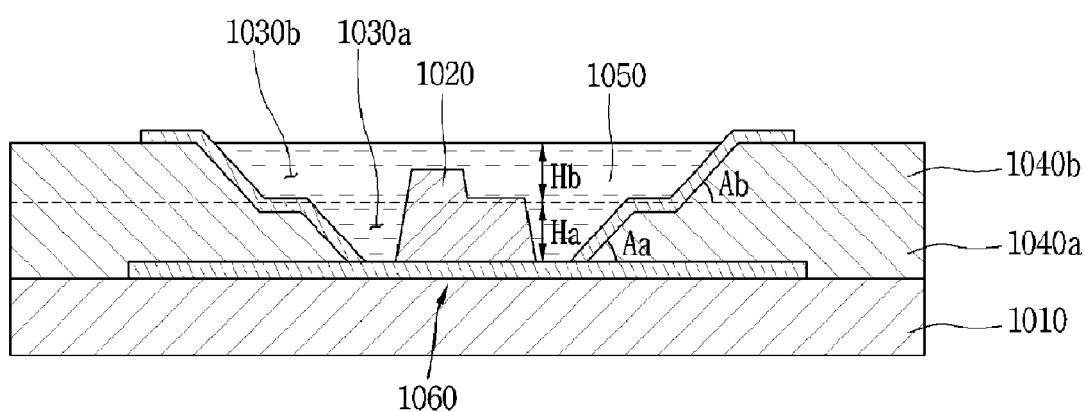
Figure 12D:
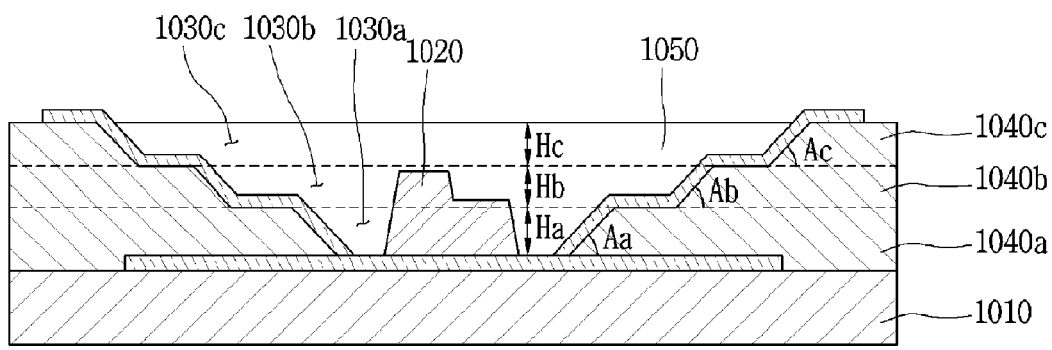
Figure 12E:
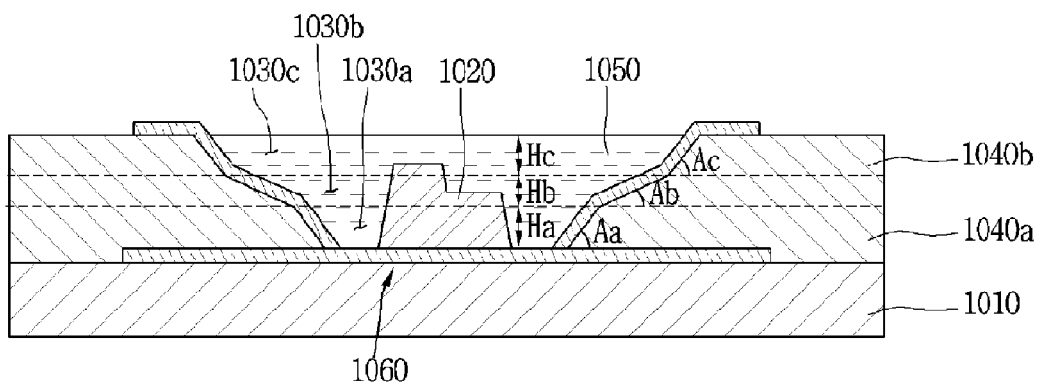
Figure 13:
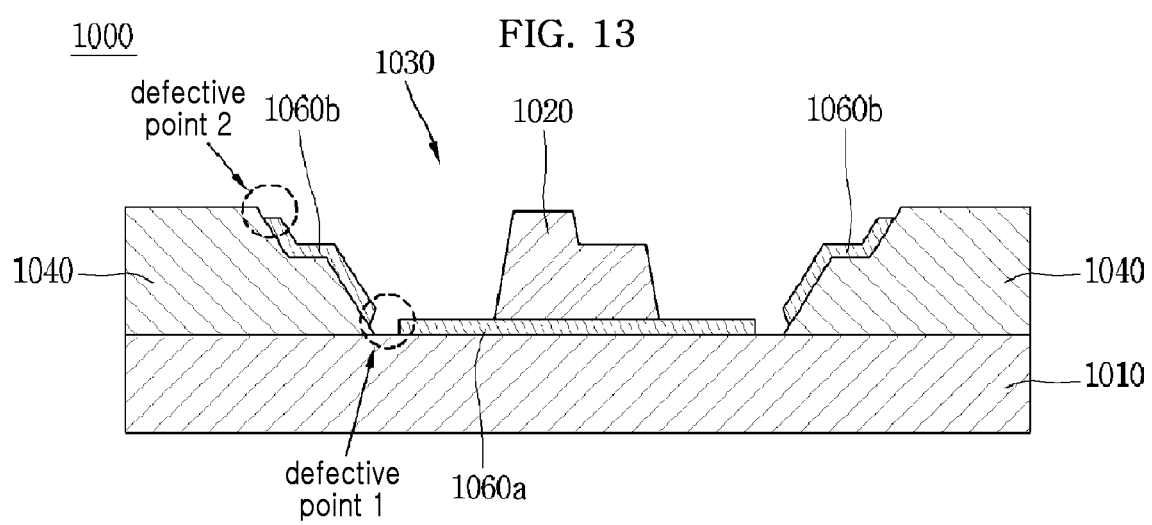
FIG. 13 is a view showing problems that may occur in a reflective layer structure according to an embodiment of the present disclosure.
Figure 14:
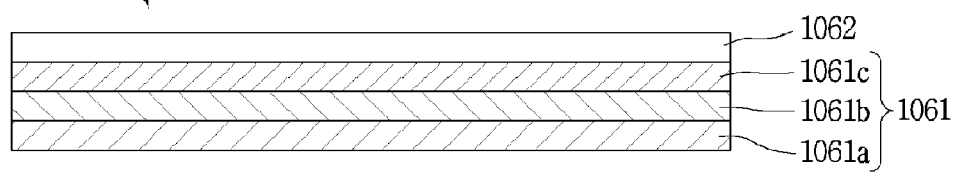
FIG. 14 is a view showing a structure of a reflective layer according to an embodiment of the present disclosure.

FIG. 10 is a view showing a vertical cross-section of a hole in which the semiconductor light emitting diode is disposed, according to an embodiment of the present disclosure, FIG. 11 is a view showing a vertical cross-section of a hole in which the semiconductor light emitting diode is disposed, according to another embodiment of the present disclosure, FIGS. 12a to 12e are views showing various embodiments of the hole shown in FIG. 11, FIG. 13 is a view showing problems that may occur in a reflective layer structure according to an embodiment of the present disclosure, and FIG. 14 is a view showing a structure of a reflective layer according to an embodiment of the present disclosure.

A display device 1000 according to an embodiment of the present disclosure may include a substrate 1010 and a plurality of semiconductor light emitting diodes 1020 disposed on the substrate 1010.

The substrate 1010 may be made of an insulating transparent material or an insulating opaque material. The substrate 1010 may include glass or polyimide (PI) in order to implement flexible performance.

The semiconductor light emitting diode 1020 disposed on the substrate 1010 may be a micro semiconductor light emitting diode, of which one side has a scale of 1 to 100 μm. For example, the semiconductor light emitting diode 1020 shown in FIG. 10 may be used.

Only a blue semiconductor light emitting diode that emits blue light may be disposed on the substrate 1010, or a green semiconductor light emitting diode that emits green light and/or a red semiconductor light emitting diode that emits red light may be disposed on the substrate 1010 together with the blue semiconductor light emitting diode. Each of the semiconductor light emitting diode 1020 may further include, as a sub-pixel, a phosphor layer (not shown) that converts the color of the emitted light on the semiconductor light emitting diode 1020 as necessary to form one pixel including red (R), green (G), and blue (B).

In the present embodiment, a separate electrode (not shown) for wiring is not disposed on the substrate 1010 by a reflective layer 1060 to be described later, and the electrode may be provided outside the substrate 1010 so as to be electrically connected to the electrode layer of the semiconductor light emitting diode 1020 through a method such as metal wiring. That is, in the present embodiment, the semiconductor light emitting diode 1020 may be provided on the substrate 1010 so that the electrode layer faces the front surface of the panel, and may be connected to an external electrode above the semiconductor light emitting diode 1020.

On the other hand, a planarization layer 1040 serving as a protective layer of the substrate 1010 may be stacked on the substrate 1010. Specifically, the planarization layer 1040 may be stacked on the substrate 1010 while forming a hole 1030 that is an area in which the semiconductor light emitting diode 1020 is disposed. The planarization layer 1040 may be made of an insulating material, for example, a photoresist, an optical polymer material, or other industrial plastic material.

A black matrix (BM) (not shown) for implementing black of the panel may be further provided on the upper surface of the planarization layer 1040. The black matrix may be formed only in a region in which a second portion 1060d extending to the upper surface of the planarization layer 1040 as a portion of the reflective layer 1060 to be described later is not formed, or may be formed to cover the second portion 1060d. The black matrix (not shown) has an effect of improving contrast.

On the other hand, the structure of the hole 1030 can be confirmed through FIG. 10. Referring to FIG. 10, the hole 1030 is a region formed by the planarization layer 1040, and the semiconductor light emitting diode 1020 may be disposed inside the hole 1030. The hole 1030 may be formed to have a width and a height greater than those of the semiconductor light emitting diode 1020 disposed inside the hole 1030. In addition, the cross-sectional shape (vertical cross-section) of the hole 1030 cut in a plane perpendicular to the substrate 1010 may have a bilaterally symmetrical structure.

The hole 1030 may be filled with a light-transmitting layer 1050. The light-transmitting layer 1050 may be made of a light-transmitting material having high transmittance in the visible ray region, and an epoxy-based photoresist, polydimethyl siloxane (PDMS), resin, or the like may be used as the light-transmitting material. By filling the peripheral region of the semiconductor light emitting diode 1020 with the light-transmitting layer 1050, reflection or total reflection of light emitted to the side of the semiconductor light emitting diode 1020 may be induced to improve light extraction efficiency.

In addition, the hole 1030 may include a reflective layer 1060 formed along at least the inner surface of the hole 1030. Here, the inner surface of the hole 1030 may refer to one surface of the substrate 1010 and the planarization layer 1040 facing the inside of the hole as shown in FIG. 10. Specifically, the inner surface of the hole 1030 may refer to the upper surface of the substrate 1010 and the side surface of the planarization layer 1040. The reflective layer 1060 is formed along at least one surface of the substrate 1010 and the planarization layer 1040 defining the inner surface of the hole 1030, so that the luminous efficiency of the semiconductor light emitting diode 1020 is improved by reflecting the light leaking to the back (substrate side) and/or side (planarization layer side) of the semiconductor light emitting diode 1020 toward the front of the panel.

In addition, the hole 1030 may be formed so that the width thereof expands as the distance from the substrate 1010 increases in order to increase the light collection efficiency by the reflective layer 1060. As shown in FIG. 12, the hole 1030 may be formed in variously modified forms within a range in which the vertical cross-section has a bilaterally symmetric structure. The related descriptions will be given later, and the reflective layer 1060 of the present disclosure will be first described in detail.

According to an embodiment of the present disclosure, the reflective layer 1060 may be formed to a predetermined thickness along at least one surface of the substrate 1010 and the planarization layer 1040 forming the inner surface of the hole 1030. Preferably, the reflective layer 1060 may be formed to a thickness of at least 30 nm in order to prevent light leakage.

The reflective layer 1060 may be formed so that a portion formed along one surface of the substrate 1010 among the inner surfaces of the hole 1030 (hereinafter, referred to as a 'lower reflective layer 1060a') have a thickness greater than a portion formed along one surface of the planarization layer 1040 (hereinafter, referred to as a 'side reflective layer 1060b'). That is, the reflective layer 1060 may be formed so that the lower reflective layer 1060a has a thickness greater than that of the side reflective layer 1060b, thereby more effectively preventing light leakage to the rear surface of the panel.

On the other hand, the reflective layer 1060 may further include a first portion 1060c extending along at least a portion of an interface between the substrate 1010 and the planarization layer 1040 and/or a second portion 1060d extending to cover at least a portion of the upper surface of the planarization layer 1040. At this time, the first portion 1060c and the second portion 1060d are portions extending from the lower reflective layer 1060a and the side reflective layer 1060b, respectively, and may complement the functions of the lower reflective layer 1060a and the side reflective layer 1060b.

For example, the first portion 1060c and the second portion 1060d may uniformly reflect the emitted light to the front surface of the panel even when the position of the semiconductor light emitting diode 1020 disposed inside the hole 1030 is not constant. That is, in the process of assembling the semiconductor light emitting diode 1020, there is an effect that the light collection efficiency can be maintained by supplementing the positional accuracy of the semiconductor light emitting diode 1020.

On the other hand, when the reflective layer 1060 is formed, as shown in FIG. 13, the lower reflective layer 1060a and the side reflective layer 1060b may be discontinuously formed (defective point 1) or the side reflective layer 1060b may be omitted in a portion of the planarization layer 1040 (defective point 2), thus causing light leaks through the defective points. In this regard, by additionally forming the first portion 1060c extending from the lower reflective layer 1060a, there is no risk of defect points (align margin) and light leakage can be prepared.

When the second portion 1060d is additionally formed, it is possible to prevent crosstalk with the semiconductor light emitting diode 1020 disposed in an adjacent hole. Light refracted from the upper portion of the hole 1030 toward the hole 1030 is re-reflected to the front of the panel, thereby improving light extraction efficiency. On the other hand, in the case of a structure in which the semiconductor light emitting diode 1020 and the wiring electrode are connected to each other at the upper portion of the hole 1030, the second portion 1060d is preferably formed only at a portion of the upper surface of the planarization layer 1040.

Referring to FIG. 14, the reflective layer 1060 includes a single-layered or multi-layered metal thin film layer 1061, and may optionally include a protective layer 1062 for insulation and anti-oxidation on the upper portion of the metal thin film layer 1061.

The metal thin film layer 1061 may have a single-layered or multi-layered structure made of a metal thin film having good reflectance. Preferably, the metal thin film layer 1061 may include one of titanium (Ti), aluminum (Al), silver (Ag), chromium (Cr), molybdenum (Mo), and platinum (Pt), or any combination thereof.

Specifically, the metal thin film layer 1061 may have a single-layered structure including a single metal thin film having good reflectivity or a multi-layered structure formed by depositing two or more metal thin films having good reflectivity. For example, the metal thin film layer 1061 may have a single-layered structure including a single metal thin film such as Ti, Al, or Ag, or a multi-layered structure in which two or more metal thin films such as Ti/Al, Ti/Al/Ti, Mo/Al, Mo/Al/Mo, or Mo/Al/Ti are stacked.

In the case of the metal thin film layer 1061 having the multi-layered structure, a metal such as Ti, Cr, Mo, or Pt may be optionally included for adhesion (or adhesive strength) between adjacent metal thin films.

In addition, each of the metal thin film layers 1061a, 1061b, and 1061c may be formed to a thickness of several nm to several tens of nm to form the reflective layer 1060 having a total thickness of 30 nm or more.

The protective layer 1062 is a thin film made of an inorganic material having light transmittance and insulating properties, such as $SiO_2$ or $SiN_x$. The protective layer 1062 is formed on the metal thin film layer 1061 to function as an insulating film or an anti-oxidation film of the metal thin film layer 1061.

On the other hand, when the upper metal thin film layer 1061 is made of Ti or Al, $TiO_2$ or $Al_2O_3$ layers that can perform substantially the same function as the protective film layer 1062 are formed on the surface. Therefore, the reflective layer 1060 may not include a separate protective layer 1062 for the metal thin film layer 1061.

On the other hand, as described above, the lower reflective layer 1060*a* may be formed to have a thickness greater than that of the side reflective layer 1060*b*. For example, the lower reflective layer 1060*a* may have a thickness different from that of the side reflective layer 1060*b* by further including at least one layer (the metal thin film layer 1061 and/or the protective layer 1062) as compared with the side reflective layer 1060*b*. Alternatively, the lower reflective layer 1060*a* and the side reflective layer 1060*b* may have the same structure, but may have different thicknesses by varying the thickness of each layer constituting the structure. As such, the lower reflective layer 1060*a* may be formed to have a thickness greater than that of the side reflective layer 1060*b*, and may be formed to have the same thickness as that of at least the side reflective layer 1060*b*.

Next, various embodiments of the hole 1030 according to an embodiment of the present disclosure will be described with reference to FIG. 12.

As shown in FIG. 11, the hole 1030 of the present disclosure may be formed so that the width thereof expands as the distance from the substrate 1010 increases. Specifically, the planarization layer 1040 defining the side surface of the hole 1030 may be inclined in a direction to expand the width of the hole 1030 as the distance from the substrate 1010 increases. The width of the hole 1030 may increase as the distance from the substrate 1010 increases due to the inclination defined by the planarization layer 1040. In addition, the cross-sectional shape (vertical cross-section) of the hole 1030 cut in a plane perpendicular to the substrate 1010 may have a bilaterally symmetrical structure. Such a structure of the hole 1030 can improve the light collection efficiency of the light emitted from the semiconductor light emitting diode 1020 disposed inside the hole 1030. In particular, the structure of the hole 1030 causes the light leaking to the side of the semiconductor light emitting diode 1020 to be directed toward the front of the panel.

Under the above-described structure, the hole 1030 may include a plurality of regions 1030*a*, 1030*b*, and 1030*c* partitioned based on an arbitrary height as shown in FIGS. 12*b* to 12*e*.

The arbitrary height that is the reference for partitioning the regions of the hole 1030 may be determined by the shape, thickness, structure, and the like of the semiconductor light emitting diode 1020 disposed inside the hole 1030. Specifically, the height that is the reference for partitioning the regions of the hole 1030 may be different according to whether the semiconductor light emitting diode 1020 disposed inside the hole 1030 is a flip-chip type or a vertical type, the thickness of the semiconductor light emitting diode 1020 in the height direction, or the like. In addition, at the height, the planarization layer 1040 may extend in a horizontal direction while expanding the width of the hole 1030.

The plurality of regions 1030*a*, 1030*b*, and/or 1030*c* may be formed to have the same height H in the height direction (FIGS. 12*b* and 12*d*), or the thicknesses H of at least one region in the height direction may be formed to be different from the thickness H of another region in the height direction (FIGS. 12*c* and 12*e*). The plurality of regions 1030*a*, 1030*b*, and/or 1030*c* may have thicknesses Ha, Hb and/or Hc, respectively.

On the other hand, the planarization layer 1040 may include a plurality of layers 1040*a*, 1040*b*, and 1040*c* stacked in the height direction of the hole 1030. Each of the layers 1040*a*, 1040*b*, and 1040*c* may be made of any one of the materials forming the planarization layer 1040. The layers 1040*a*, 1040*b*, and 1040*c* may be made of the same material, or at least the adjacent layers may be made of different materials. In the latter case, the planarization layer 1040 may be formed by depositing a plurality of layers.

In addition, the planarization layer 1040 may have a predetermined slope (or 'inclination angle (A)') with respect to the substrate 1010 or an imaginary plane parallel to the substrate 1010. The slopes of the planarization layers 1040*a*, 1040*b*, and 1040*c* included in the respective regions may be equal to each other (FIGS. 12*b* and 12*d*), or the slope of the planarization layer included in at least one region may be different from the slope of the planarization layer included in another region (FIGS. 12*c* and 12*e*). Here, the planarization layer included in a certain region may refer to the planarization layer defining the side surface of the region (for example, the planarization layer 1040*a* included in the first region 1030*a* refers to the planarization layer 1040*a* defining the side surface of the first region 1030*a*). The planarization layer 1040 may be formed to have an inclination angle A of 20° or more and 90° or less with respect to the substrate 1010 or an imaginary plane parallel to the substrate 1010. The planarization layers 1040*a*, 1040*b*, and/or 1040*c* may have inclination angles Aa, Ab and/or Ac with respect to the substrate 1010 or the imaginary plane parallel to the substrate 1010.

The thicknesses H of the plurality of regions 1030*a*, 1030*b*, and 1030*c* in the height direction and the slopes of the planarization layers 1040*a*, 1040*b*, and 1040*c* included in the respective regions may be modified and implemented in various forms as shown in FIG. 11, considering the structure and shape of the semiconductor light emitting diode 1020 disposed inside the hole 1030 and the amount of light extracted to the front of the panel.

On the other hand, the planarization layer 1040 and the reflective layer 1060 defining the side surface of the hole 1030 according to the present disclosure may be formed by spin coating. By controlling a rotation speed of a spin coater, the planarization layer 1040 and the reflective layer 1060 may be formed to be inclined, and the slope thereof may be controlled. In addition, the planarization layer 1040 and the reflective layer 1060 may be formed by various known methods including slit coating.

The hole 1030 according to the present disclosure may be formed in various shapes (horizontal cross-section), including a rectangular shape and a circular shape, which can collect the light emitted from the semiconductor light emitting diode 1020 to the front surface of the panel. Preferably, the hole 1030 may be formed in a circular shape. In this case, this is advantageous in terms of align margin in the process of aligning the position of the semiconductor light emitting diode 1020 on the transfer substrate and the position of the hole 1030 formed in the substrate 1010 so as to correspond to each other in order to transfer the semiconductor light emitting diode 1020 to the substrate 1010.

The display device 1000 using the semiconductor light emitting diode according to an embodiment of the present disclosure has an effect of efficiently collecting light emitted from the semiconductor light emitting diode 1020 to the front surface of the panel due to the shape and structural characteristics of the hole 1030 in which the semiconductor light emitting diode 1020 is disposed.

The display device 1000 using the semiconductor light emitting diode described above can be applied not only to the passive matrix (PM) type semiconductor light emitting diode, but also to the active matrix (AM) type semiconductor light emitting diode.

The present disclosure described above is not limited to the configuration and method of the embodiments described above, and all or part of the embodiments may be selectively combined so that various modifications can be made.

The invention claimed is:

1. A display device comprising:
a semiconductor light emitting diode disposed on a substrate;
a planarization layer stacked on the substrate while defining a hole that is a region in which the semiconductor light emitting diode is disposed;
a light-transmitting layer filling the hole; and
a reflective layer disposed along at least one surface of the substrate and the planarization layer defining an inner surface of the hole,
wherein the hole is disposed so that a width thereof expands as a distance from the substrate increases,
wherein the reflective layer comprises:
a lower reflective layer disposed along the at least one surface of the substrate among inner surfaces of the hole;
a side reflective layer disposed along one surface of the planarization layer;
a first portion interposed between an upper surface of the substrate and a lower surface of the planarization layer to extend along at least a portion of an interface between the upper surface of the substrate and the lower surface of the planarization layer, and the first portion extending from the lower reflective layer and being coplanar with the lower reflective layer; and
a second portion extending to cover at least a portion of an uppermost surface of the planarization layer, and preventing crosstalk with semiconductor light emitting diodes disposed in adjacent holes, and
wherein the second portion of the reflective layer extends from the side reflective layer, and forms an uppermost surface of the reflective layer so that a portion of the planarization layer is interposed between the second portion of the reflective layer and the first portion of the reflective layer in a thickness direction of the planarization layer.

2. The display device of claim 1, wherein a cross-sectional shape of the hole has a bilaterally symmetrical structure when cut in a plane perpendicular to the substrate.

3. The display device of claim 1, wherein the hole includes a plurality of regions partitioned based on height relative to the substrate, and
wherein thicknesses of the respective plurality of regions in a height direction are equal to each other.

4. The display device of claim 1, wherein the planarization layer is inclined to expand the width of the hole as the distance from the substrate increases.

5. The display device of claim 4, wherein the hole includes a plurality of regions partitioned based on height relative to the substrate, and
wherein slopes of the planarization layer included in the respective plurality of regions with respect to the substrate or an imaginary plane parallel to the substrate are equal to each other.

6. The display device of claim 4, wherein the hole includes a plurality of regions partitioned based on height relative to the substrate, and
wherein a slope of the planarization layer included in at least one of the plurality of regions with respect to the substrate or an imaginary plane parallel to the substrate is different from a slope of the planarization layer included in another region of the plurality of regions.

7. The display device of claim 1, wherein the planarization layer includes a plurality of layers stacked in a height direction of the hole, and at least adjacent layers of the planarization layer are made of different materials.

8. The display device of claim 1, wherein the lower reflective layer is thicker than the side reflective layer.

9. The display device of claim 1, wherein the reflective layer comprises a metal thin film layer having a single-layered or multi-layered structure, and
wherein the metal thin film layer is made of one of titanium (Ti), aluminum (Al), silver (Ag), chromium (Cr), molybdenum (Mo), and platinum (Pt), or any combination thereof, and is formed to a thickness of at least 30 nm or more.

10. The display device of claim 9, wherein the reflective layer further comprises a protective layer made of $SiO_2$ or SiNx on the metal thin film layer.

11. The display device of claim 1, wherein the hole has a circular horizontal cross-section.

12. The display device of claim 1, further comprising a black matrix on the uppermost surface of the planarization layer.

13. The display device of claim 1, wherein the hole includes a plurality of regions partitioned based on height relative to the substrate, and
wherein a thickness of at least one of the plurality of regions in a height direction is different from a thickness of another region of the plurality regions in the height direction.

14. A display device comprising:
a planarization layer disposed on a substrate and defining a hole;
a semiconductor light emitting diode disposed on the substrate and disposed in the hole; and
a reflective layer,
wherein the reflective layer comprises:
a lower reflective layer disposed along at least one surface of the substrate among inner surfaces of the hole;
a side reflective layer disposed along one surface of the planarization layer;
a first portion interposed between an upper surface of the substrate and a lower surface of the planarization layer to extend along at least a portion interface between upper the upper surface of the substrate and the lower surface of the planarization layer, and the first portion extending from the lower reflective layer and being coplanar with the lower reflective layer; and
a second portion extending to cover at least a portion of an uppermost surface of the planarization layer, and preventing crosstalk with semiconductor light emitting diodes disposed in adjacent holes, and
wherein the second portion of the reflective layer extends from the side reflective layer, and forms an uppermost surface of the reflective layer so that a portion of the planarization layer is interposed between the second portion of the reflective layer and the first portion of the reflective layer in a thickness direction of the planarization layer.

15. The display device of claim 14, further comprising a light-transmitting layer disposed in the hole and surrounding the semiconductor light emitting diode.

16. The display device of claim 15, wherein an upper surface of the light-transmitting layer is disposed higher than the uppermost surface of the planarization layer.

17. The display device of claim 14, wherein an inner side surface of the planarization layer is inclined to expand a width of the hole as a distance from the upper surface of the substrate increases.

18. The display device of claim 17, wherein the planarization layer includes a plurality of regions partitioned based on height, and
- wherein a slope of the planarization layer included in at least one of the plurality of regions with respect to the upper surface of the substrate or an imaginary plane parallel to the upper surface of the substrate is different from a slope of the planarization layer included in another region of the plurality of regions.

\* \* \* \* \*